United States Patent
Reime

(10) Patent No.: US 6,965,327 B2
(45) Date of Patent: Nov. 15, 2005

(54) DEVICE AND METHOD FOR EVALUATING A USEFUL SIGNAL ORIGINATING FROM A PROXIMITY SENSOR

(76) Inventor: Gerd Reime, Friedenstrasse 88, D-75328 Schömberg (DE)

( * ) Notice: Subject to any disclaimer, the term of this patent is extended or adjusted under 35 U.S.C. 154(b) by 590 days.

(21) Appl. No.: 10/181,034

(22) PCT Filed: Jan. 16, 2001

(86) PCT No.: PCT/EP01/00441

§ 371 (c)(1),
(2), (4) Date: Jul. 12, 2002

(87) PCT Pub. No.: WO01/54277

PCT Pub. Date: Jul. 26, 2001

(65) Prior Publication Data

US 2003/0001756 A1 Jan. 2, 2003

(30) Foreign Application Priority Data

Jan. 18, 2000 (DE) .......................... 100 01 943

(51) Int. Cl.[7] ............................................. H03M 11/00
(52) U.S. Cl. .......................... 341/31; 345/156; 340/555
(58) Field of Search ............................. 341/31, 22, 26; 340/555; 307/112; 250/200, 221; 345/157, 158, 156, 175

(56) References Cited

U.S. PATENT DOCUMENTS

| | | | |
|---|---|---|---|
| 4,381,446 A | | 4/1983 | Fukuyama et al. |
| 4,943,712 A | | 7/1990 | Wilder |
| 5,103,085 A | | 4/1992 | Zimmerman |
| 5,444,264 A | * | 8/1995 | Heinonen et al. ...... 250/559.29 |
| 5,592,033 A | | 1/1997 | Gold |
| 6,313,825 B1 | | 11/2001 | Gilbert |
| 6,828,546 B2 | | 12/2004 | Reime |

FOREIGN PATENT DOCUMENTS

| | | |
|---|---|---|
| DE | 31 46 152 A1 | 6/1983 |
| DE | 35 24 492 A1 | 1/1987 |
| DE | 35 26 992 C2 | 2/1987 |
| DE | 42 07 772 C2 | 9/1993 |
| DE | 42 12 562 A1 | 10/1993 |
| DE | 43 39 572 A1 | 5/1995 |
| DE | 199 14 114 A1 | 10/1999 |
| EP | 0 518 648 A2 | 12/1992 |
| EP | 0 551 240 A1 | 7/1993 |
| FR | 2 693 859 A1 | 1/1994 |
| WO | WO 86/01953 A1 | 3/1986 |
| WO | WO 95/01561 A1 | 1/1995 |
| WO | WO 01/54276 A1 | 7/2001 |

OTHER PUBLICATIONS

Matsuda Katsuya, "Optical Touch Switch", Patent Abstracts of Japan No. 08 273 503, vol. 1997, No. 02, filed Oct. 18, 1996.

(Continued)

Primary Examiner—Michael Horabik
Assistant Examiner—Hung Dang
(74) Attorney, Agent, or Firm—Venable LLP; Robert Kinberg; Jeffrey W. Gluck

(57) ABSTRACT

The invention relates to a device and method for evaluating a useful signal U(t) originating from a proximity sensor. The device comprises a first recognition means (17) which changes the switching state thereof when the value ($U_1(t)$) of a first signal produced from the useful signal exceeds a first limit value that characterizes the proximity of an object. In addition, a second recognition means (34) is provided which changes the switching state thereof from a first to a second state when the value (U(t)) of the useful signal exceeds a second limit value that characterizes the removal of an object. A decision means (32), which is connected to the first recognition means (17) and to the second recognition means (34), changes its switching state when the first recognition means (17) changes the switching state thereof from its first to a second switching state, and the second recognition means does not change the switching state thereof during a predetermined first time span ($\Delta t_1$) after the switching state of the first recognition means is changed.

18 Claims, 8 Drawing Sheets

OTHER PUBLICATIONS

Masanobu Kazunori, "Object Detector", Patent Abstracts of Japan No. 58 147 670, vol. 007, No. 266, (P–239), filed Sep. 2, 1983.

Koshimizu Atsushi, "Touch Switch Device", Patent Abstracts of Japan No. 08 096 677, vol. 007, No. 266, (P–239), filed Apr. 12, 1996.

Ito Masaru, "Touch Switch Device", Patent Abstracts of Japan No. 07 296 670, vol. 1996, No. 03, filed Nov. 10, 1995.

Toshifumi Fukuyama, "Ways To Prevent Malfunction In Photoelectric Switches", Journal of Electronic Engineering, vol. 21:59–63, (1984).

Sako Michiya, "Comparator with Hysteresis," Patent Abstracts of Japan No. 01093915, vol. 13, No. 330, filed May 10, 1987.

* cited by examiner

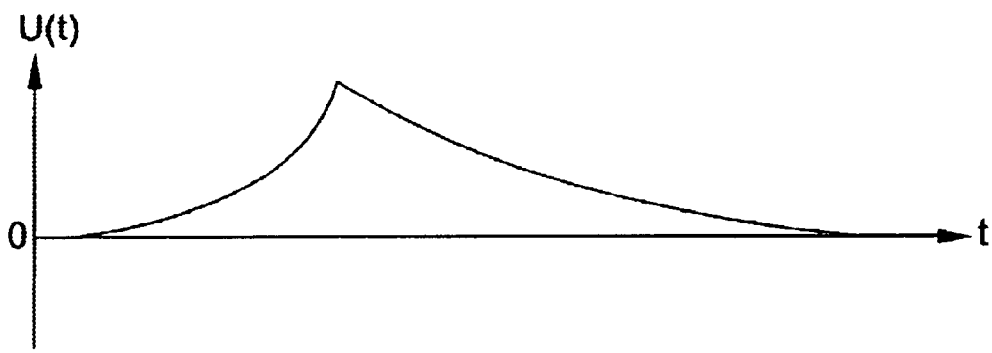
FIG. 2
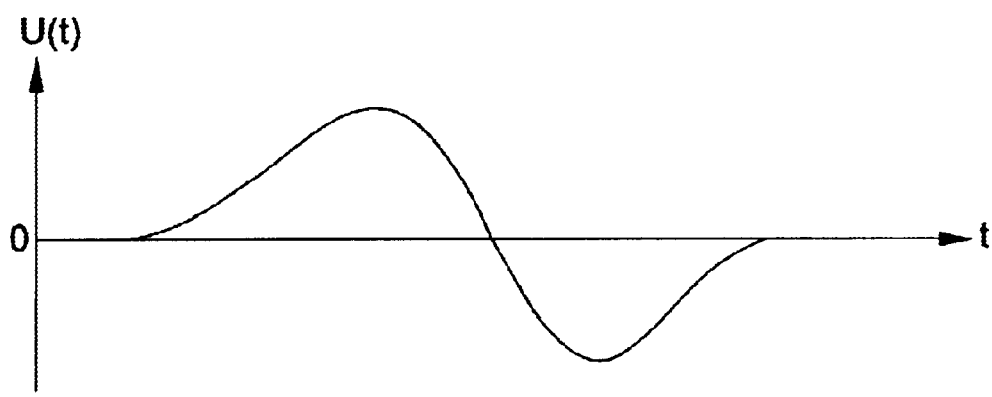
FIG. 3.1
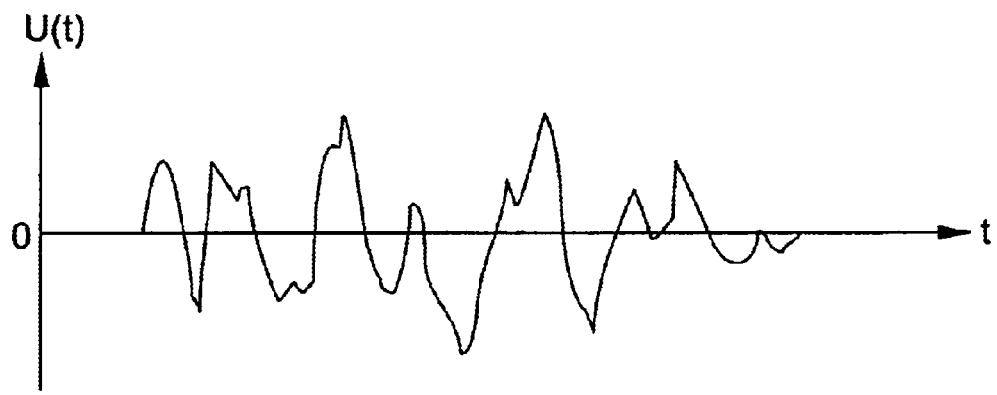
FIG. 3.2

DEVICE AND METHOD FOR EVALUATING A USEFUL SIGNAL ORIGINATING FROM A PROXIMITY SENSOR

REFERENCE TO RELATED APPLICATIONS

The present application claims priority of German application 100 01 943.9, filed on Jan. 18, 2000, the disclosure content of which is hereby expressly also made the object of the present application.

FIELD OF THE INVENTION

The invention relates to a device as well as a method for evaluating a useful signal originating from a proximity sensor, more especially from an opto-electronic proximity sensor.

BACKGROUND TO THE INVENTION

In almost all electric or electronic devices, manual operation is effected by switches. These switches are almost always designed mechanically, two metal parts being brought into contact or respectively out of contact in order to close or respectively to open a circuit. However, this mechanical design has the disadvantage, amongst others, that it has mechanical wearing parts and consequently only has a limited service life and is fundamentally water-sensitive, such that, where required, a costly casing is necessary.

Optical switches are already known; however, up to now they have been extremely lavish and, consequently, expensive and do not yet have the required standard of operational reliability. However, in principle, optical switches have advantages, as they manage, generally speaking, without any moving mechanical parts and the switching process can be triggered by mere tapping or by contacting a control surface or by simply through approximation to a sensor.

Furthermore, so-called proximity sensors or also rain sensors are known in the technology, by means of which the displacement of an object onto a surface or the contacting or wetting of a surface can be detected, devices being known in these cases which output a signal containing data regarding the direction of displacement and the speed of displacement of the object. Such a device is known, for example, in WO 95/01561.

OBJECT OF THE INVENTION

It is the object of the invention to make available a device or respectively a method for evaluating a useful signal originating from a proximity sensor, by means of which signal an optical switch can be operated. Optical switch in this case means that through the intermediary of a defined displacement, for example of a finger, a defined switching process is triggered, that is to say more especially the interrupting or respectively closing of an electric circuit.

SUMMARY THE INVENTION

These and other objects are achieved according to the invention by the provision of a device for evaluating a useful signal having a value, the useful signal originating from a proximity sensor, wherein the value of the useful signal changes with an approach of an object to the proximity sensor and with a removal of the object from the proximity sensor and wherein direction and amount of this change are characteristic of at least one of direction, speed, and distance of the object. The device includes a first recognizing means having an output which changes from a first switching state to a second switching state when a first value of the useful signal, or a first value of a first signal generated from the useful signal, exceeds or falls below a first limit value which is characteristic of the object approaching the proximity sensor; a second recognizing means having an output which changes from a first switching state to a second switching state when a second value exceeds or falls below a second limit value, which is characteristic of at least one of the object approaching the proximity sensor and the object being removed from the proximity sensor; a first deciding means coupled to the output of the first recognizing means and the output of the second recognizing means, and having an output which changes from a first switching state to a second switching state when the first recognizing means changes its switching state and when the second recognizing means maintains its switching state, and wherein the first deciding means remains in the second switching when the second recognizing means maintains its switching state for a predetermined first time slot after the switching state of the first recognizing means has been changed; a time detection circuit having an output, the time detection circuit being coupled to the output of the first deciding means, the output of the time detection circuit being set to an active state when the output of the first deciding means is set to an active state for a time slot which is longer than the predetermined time slot; and a second deciding means coupled to the output of the time detection circuit and being set when the output the time detection circuit is set to its active state. Modifications will be readily apparent to those skilled in the art, and this application is intended to cover any adaptations or variations thereof The exemplary embodiment and other examples given in this application are examples only and not intended to limit the scope of the invention.

To better represent the invention, the arrangement described in WO 95/01561 is initially represented in brief, the disclosure content of which is hereby expressly also made an object of the present application. However, it must be stressed that the present invention is not restricted to operating only with the arrangement described in this case, but can operate whenever there is a useful signal, which contains speed data and direction data on a moving object. This speed data, as a rule, is only available in one dimension and this is also sufficient for the operation of the device according to the invention, however multi-dimensional data can also be evaluated. In the present case, the useful signal is an analogue voltage signal, but this is not urgently necessary. It could also be, for example, a digitalized signal.

Example of an Applicable Proximity Sensor

FIG. 7 shows a proximity sensor, as is known substantially in WO 95/0156 1. At least two light-emitting diodes 1, 3 are disposed under a glass plate 31, the light of which light-emitting diodes can be reflected at least partially at the glass plate 31 and fall on the photodiode 2. A correspondingly set-up light-emitting diode can also act as photodiode.

The glass plate or another surface should be translucent to light at least in a certain wavelength range. The light emitted from the light-emitting diode 3 does not act as a measuring section in this case, but is only required to compensate for the external light. It is consequently conceivable and in many cases expedient to block the light path of this light-emitting diode to the effect that it cannot penetrate to the outside. An arrangement 116 for blocking one of the two beams of light is represented in FIG. 9. It is also conceivable to configure the first light-emitting diode 1 as a long range emitting laser diode with radiation region b, and to configure the second light-emitting diode as a light-emitting diode, which only emits in the short range, with radiation region a (FIG. 8). In addition, the light-emitting diodes can be separated from one another by a separating wall 113 in the housing 104. This is a modification of the arrangement described in WO 95/01 561, which can be sensible for the present purpose.

The light of the light-emitting diode 1 is only partially reflected at the glass pate 31 and consequently passes to the outside, the light being reflected, in its turn, by an object, in this case a finger, and consequently being able to be diffused back at least partially into the photodiode 2. The two light-emitting diodes are supplied with voltage by means of a clock generator 13, the voltage signal of one of the two light-emitting diodes being inverted. Where the light output of the diodes is even and where the reflection is precisely symmetrical or where there is suitable regulation of the light brightness of at least one of the two diodes (see below), there is a direct current voltage signal at the output of the photodiode 2, which direct current voltage signal is supplied to a high-pass filter 32 to eliminate direct current voltage and low-frequency alternating-current portions. The high-pass filter 32, the cut-off frequency of which is below the frequency of the clock generator 13, sets the signal supplied to it to "0" as long as it is a direct current voltage signal. Influences from external light sources are excluded with this arrangement.

This signal, filtered in this way, is supplied to an amplifier 4 and then to a synchronous demodulator 5. The synchronous demodulator 5 receives its clock signal from the frequency generator 13, this clock signal being delayed accordingly by the delay unit 15 for adaptation to the signal run times in the high-pass filter 32 and in the amplifier 4. The synchronous demodulator 5 divides the signal of the light sources 1 and 3, which is common to the signal path of the light receiver 2, of the high-pass filter 32 and of the amplifier 4, back into two separate paths. The signal sections cut out by the synchronous demodulator 5, are cleaned in the low pass filters 6 and 7 of nuisance spectral regions and are supplied to the comparator 9. In the case represented, the comparator 9 comprises a simple operation amplifier. The difference values corresponding to the light emitters are at the outputs of the respective low pass filters 6 and 7. In the correspondingly tuned state, that is two times the value zero. These two signals are supplied to the comparator 9. The voltage value U(t), the useful signal, is at the output of this comparator. This signal is also supplied to the signal centering level 11 via a low pass filter 10.

The output of the signal centering level 11 is connected to a regulator 12, which regulates the signal voltage for the light-emitting diode 3. The achievement of this arrangement is that the useful signal changes where there is a change in the reflection of the light beam emitted by the light-emitting diode 1, however is always continuously returned to zero value. The time constant for this resetting is determined in the exemplified embodiment by the low-pass filter 10.

It is an object of the invention to use the useful signal U(t) to the effect that a defined switching process is triggered by a defined displacement of an object. In the present example, the tapping of a finger, of a hand or of another part of the body of the user onto a sensor-active region S on the glass plate 31 is to be detected and a switching process consequently triggered. However, other applications are conceivable, where the displacement of a mechanical element, for example a so-called "jumping jack", is to be detected.

BRIEF DESCRIPTION OF THE DRAWINGS

The invention is now explained in more detail by way of an exemplified embodiment. In which:

FIG. 2 is the curve of the useful signal U(t) when the sensor-active region is tapped, FIG. 3.1 is the curve of the measuring signal when the sensor-active region is wiped over, FIG. 3.2 is the curve of the useful signal, if, for example, a cloth is moved rapidly to and fro on the glass plate.

DETAILED DESCRIPTION OF PREFERRED EMBODIMENTS

The invention is now described in more detail as an example with reference to the enclosed drawings. However, the exemplified embodiments are only examples, which are not to restrict the inventive concept to one certain arrangement.

Figure 1A:
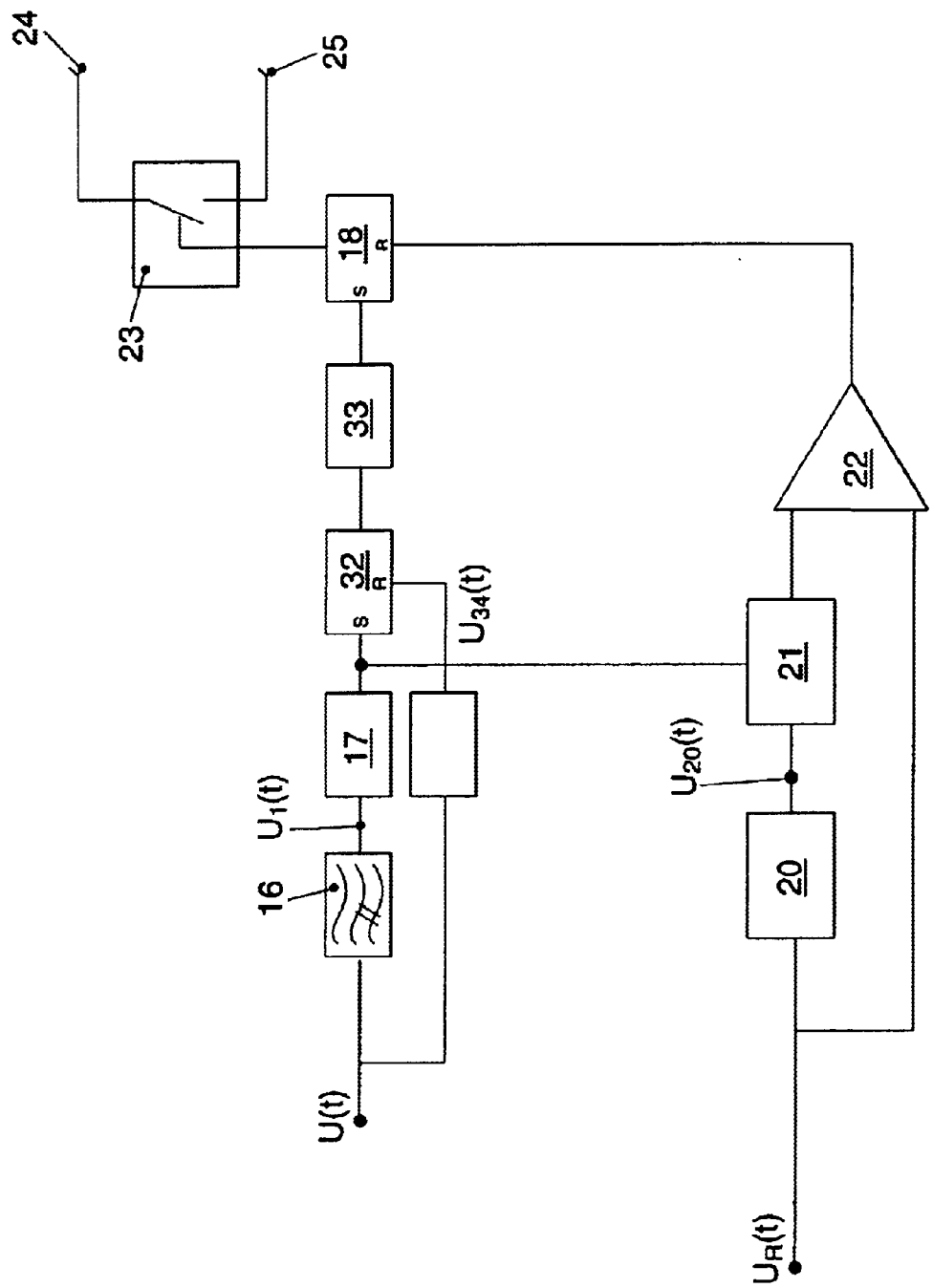
FIG. 1a is a switching arrangement for the evaluating according to the invention of a useful signal.
Figure 1B:
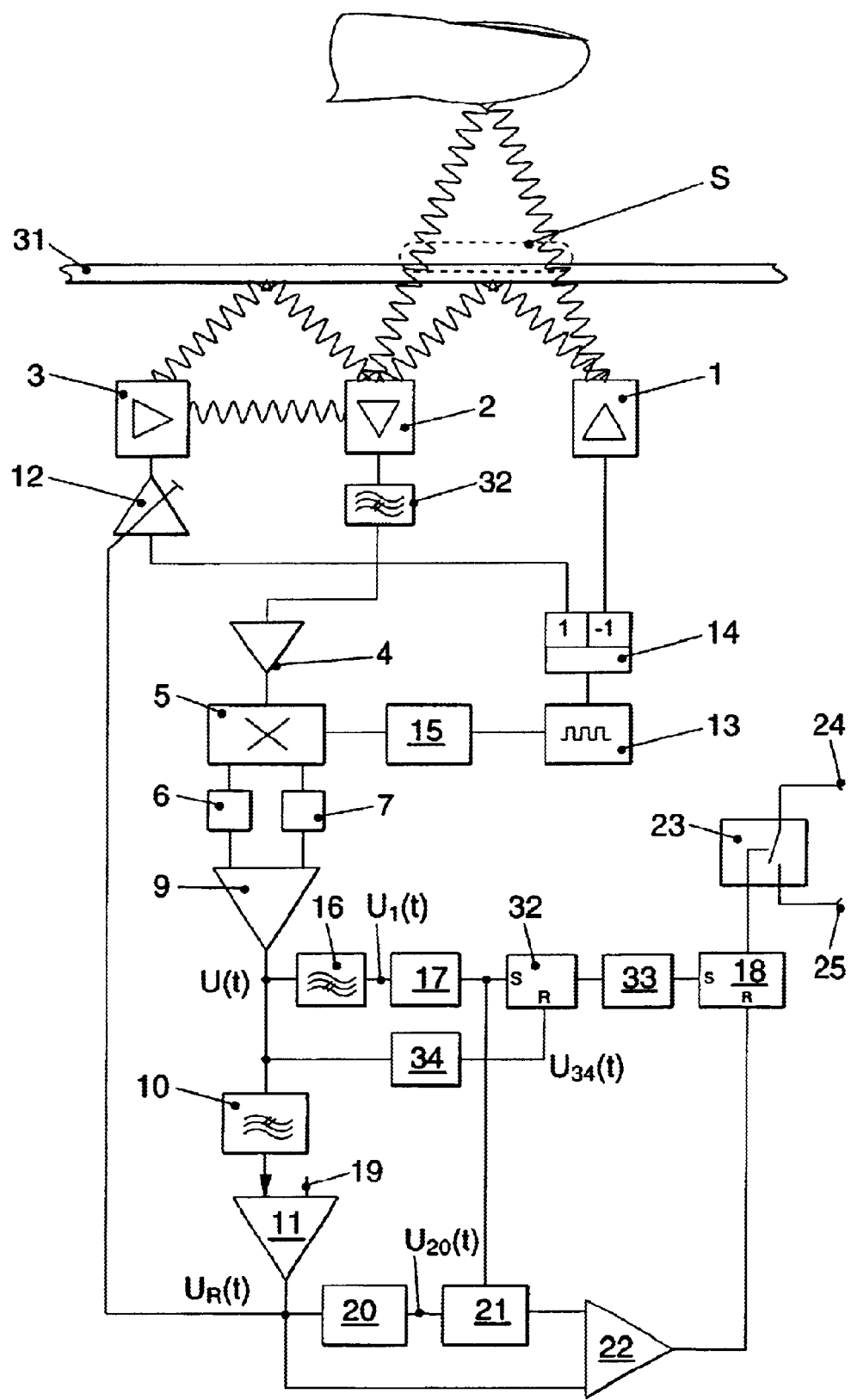
FIG. 1b is a complete arrangement of an optical switch.
Figure 4:
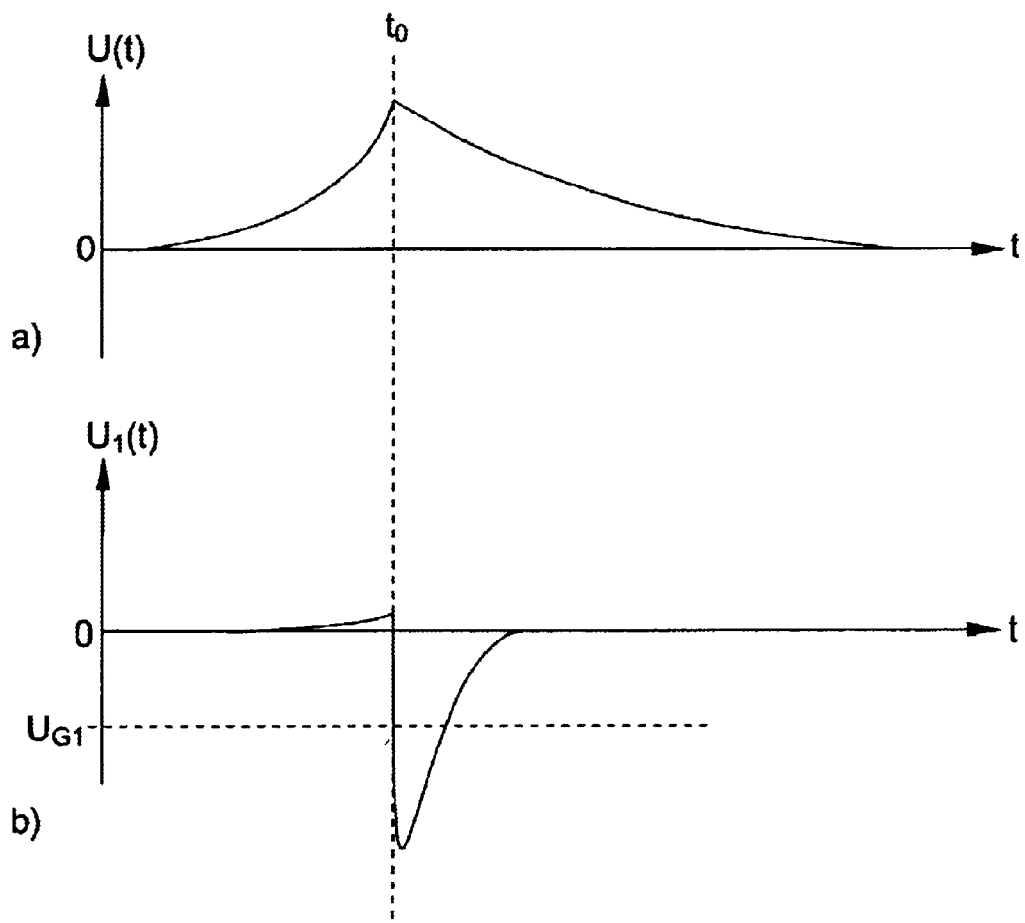
FIG. 4a is the curve of the useful signal U(t) when the sensor-active region is tapped.
FIG. 4b is the curve of the differentiated displacement signal $U_1(t)$ when the sensor-active region is tapped.

The useful signal U(t) output by the sensor device described above is represented in various situations in FIGS. 2, 3.1, and 3.2. FIG. 2 records the useful signal U(t) when the sensor-active region S is tapped. A switching process is to be triggered by this type of signal. Useful signal curves are recorded in FIG. 3.1 and FIG. 3.2, as occur when the sensor-active region S is wiped over once or respectively when it is wiped over to and fro. These types of signal curves are not to trigger any switching processes. This goal is achieved with this embodiment as follows (FIG. 1a):

The useful signal U(t) is supplied to the high-pass filter 16, which works here as differentiator, such that the value $U_1(t)$ of the differentiated displacement signal is situated at the output of the high-pass filter. Where an object, for example a finger, is displaced onto the sensor-active surface of the glass plate 31, the value U(t) of the useful signal increases slowly analogous to the displacement and stops suddenly when the finger is braked on the glass plate 31, see FIGS. 2 and 4a. If the finger remains and does not move, the value U(t) of the useful signal is regulated slowly back to $U_0$. The sudden change in value of the useful signal results at the output of the high-pass filter 16 in a jump in the value of the displacement signal $U_1(t)$, see FIG. 4b. This is detected by the threshold value switch 17 when a predetermined negative value $U_{G1}$ is exceeded and the output of the first threshold switch 17, which is connected to the set-input of the first flip-flop 32, is set to active and consequently the first flip-flop 32 is set. The cut-off frequency of the high-pass filter 16 is selected such that a tapping at moderate speed still results in an easily detectable signal. The cut-off frequency could, for example, be in the range of 100 Hertz.

A signal generated from the useful signal is used therefore in this case, that is to say the displacement signal obtained through differentiation, and this triggers a first process when its value $U_1(t)$ exceeds a certain limit value $U_{G1}$. Switching arrangements and cases of application are also conceivable, however, where the useful signal is used directly and triggers a process—change in flip-flop state in this case—, when the value U(t) of the useful signal exceeds a certain value or falls below a certain value.

Figure 5:
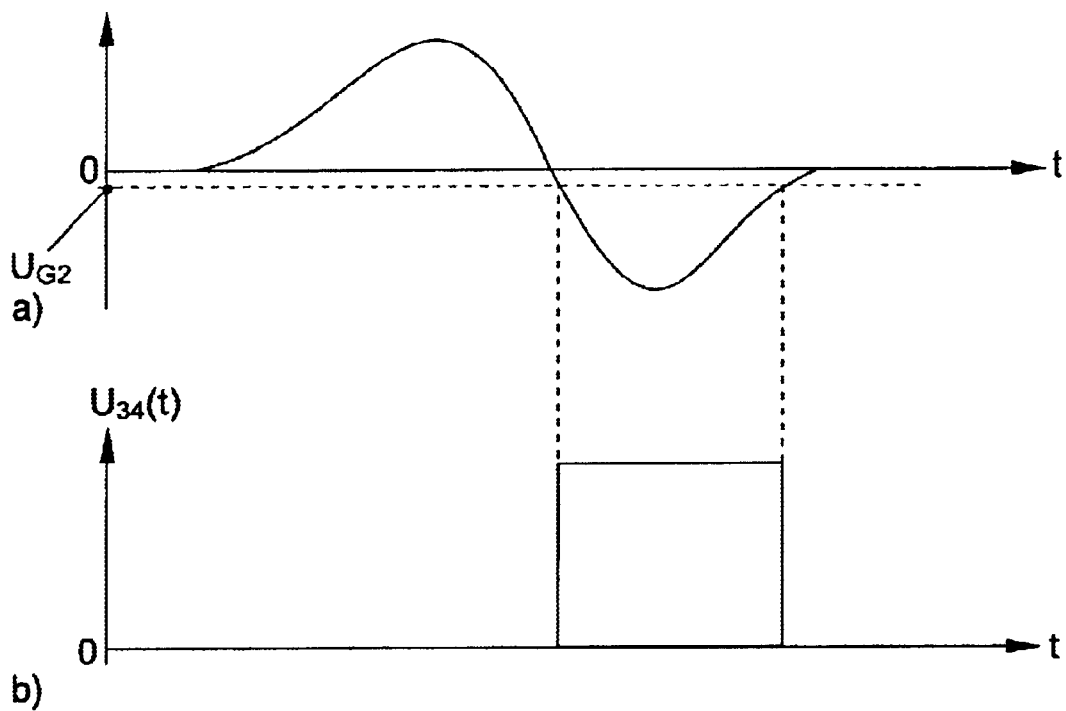
FIG. 5a is the curve of the measuring signal when the sensor-active region is wiped over.
FIG. 5b is the curve of the output signal of the first threshold value switch in the situation represented in FIG. 5a, FIG. 6 is the signal curves of $U_{20}(t)$ and $U_R(t)$, as well as the stored value $U_R(t_0)$.

Every displacement, which is quick enough and covers the first sensor-active region, triggers this process, i.e. the output of the first flip-flop 32 is initially set to active. A wiping movement or similar is also sufficient to do this, but it is not, however, to be recognized as a deliberate switching process (see FIGS. 3.1 and 3.2). This is why the useful signal is supplied to a second threshold switch 34, which becomes active when the value U(t) of the useful signal falls below a certain second threshold value $U_{G2}$. The fact that the removing of an object (removal of a finger) results in a reducing of U(t) in the opposite direction in comparison with the approximation is made use of here, in the example in the negative range (FIG. 3.1). Where the second threshold value $UG_2$ of the second threshold value switch 34 is exceeded in the negative direction, its output $U_{34}(t)$ is set to active (see FIG. 5).

Since the output of the threshold value switch 34 is connected to the reset-input of the flip-flop 32, setting this output to active will reset the flip-flop 32. Therefore, when there is a wiping or similar movement which has set the flip-flop to active, flip-flop 32 is reset to zero a short time later. This means that the output of the flip-flop 32 is reset back to zero. The output signal of the flip-flop 32 is then supplied to the time detection circuit 33. The time detection circuit 33 is set up such that its output is only set to active if the flip-flop 32 has been active longer than a predetermined time $\Delta t_1$, for example 100 ms. This predetermined first time slot $\Delta t_1$ corresponds substantially to the normal minimum dwell time of a finger, a hand or another part of the body when tapping a switch, which is configured as an electric switching element.

The output of the time detection circuit 33 is connected to the set-input of the second flip-flop 18. Where there is a deliberate tapping of the sensor-active surface, the output of the second flip-flop 18 is consequently set to active, as in this case the time between setting the first flip-flop 32 and resetting this flip-flop is greater than $\Delta t_1$, in other words: The finger remains longer than $\Delta t_1$ on the sensor-active region S. However, where there are movements which are not to trigger any switching process—for example wiping over with a cloth—, the time between setting and resetting the first flip-flop 32 is smaller than $\Delta t_1$, such that these movements do not result consequently in the second flip-flop 18 being set. Therefore, by tapping the sensor-active surface, therefore, the state of the second flip-flop 18 is changed in a controlled manner. The output of the flip-flop 18 can also be connected to a switch 23, for example a relay.

Figure 6:
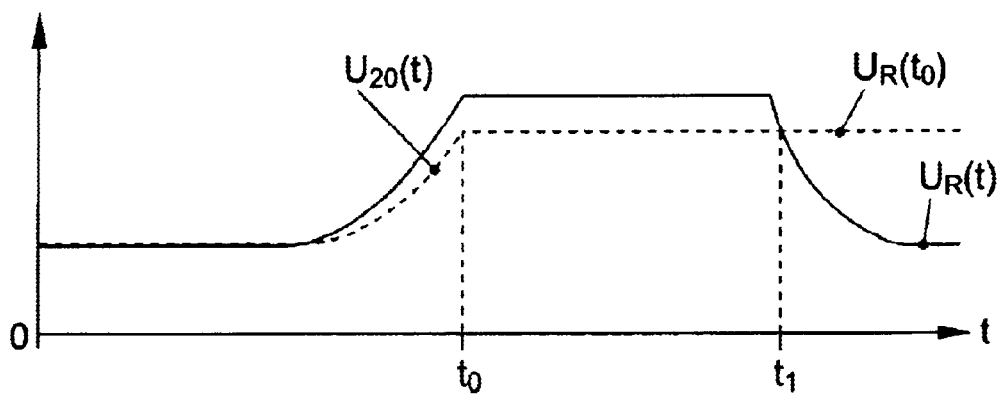
Figure 7:
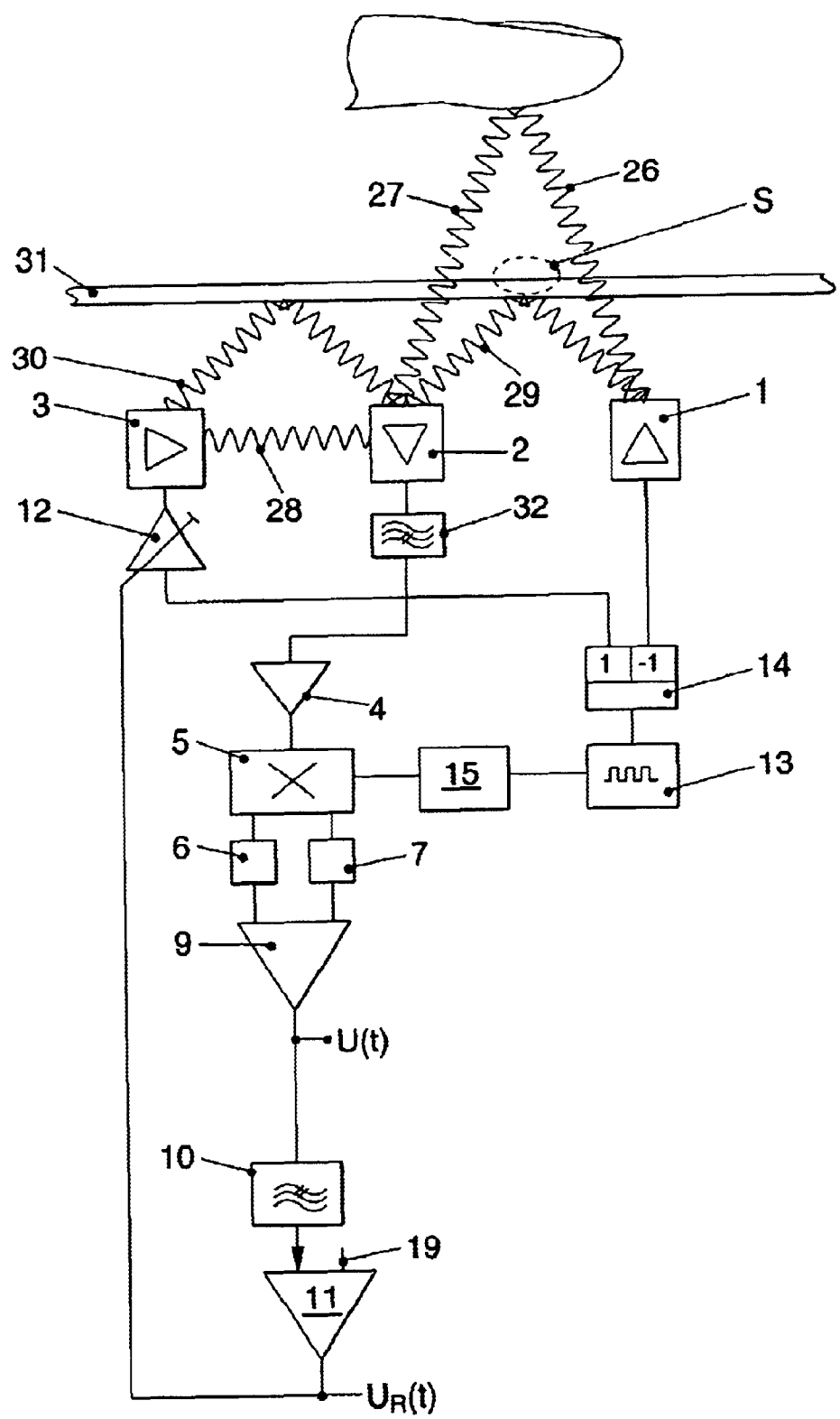
FIG. 7 is a proximity sensor according to the state of the art.
Figure 8:
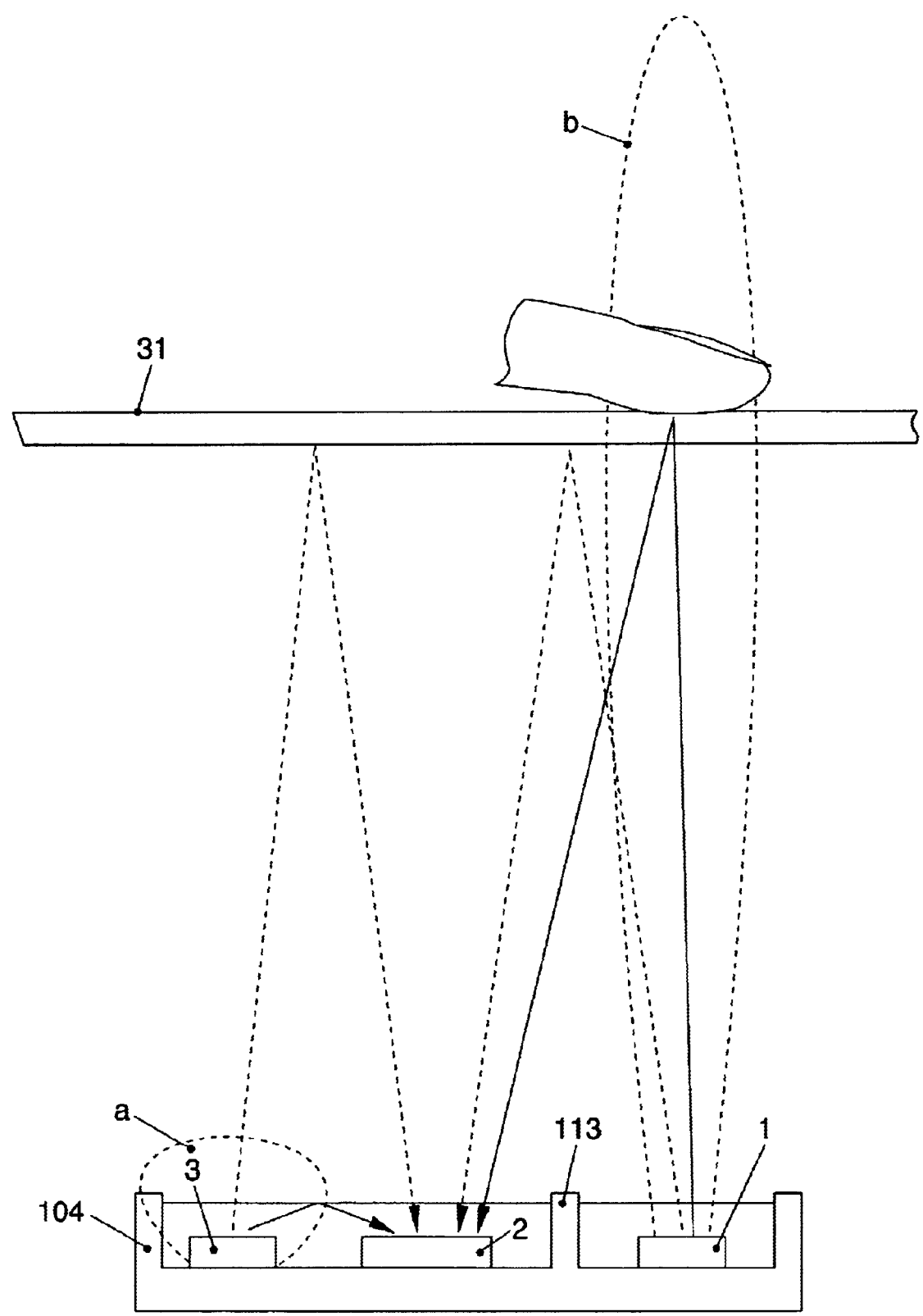
FIGS. 8, 9 are possible modifications to the proximity sensor in FIG. 7
Figure 9:
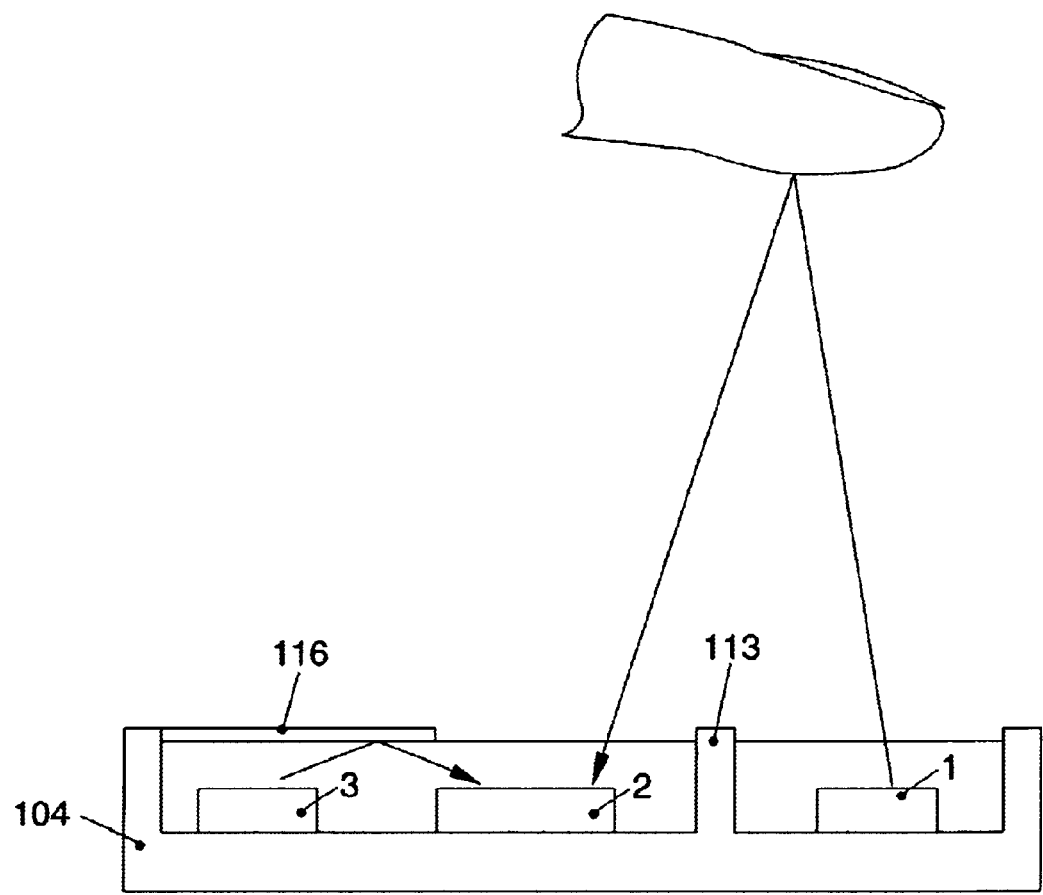

In many application cases it is desirable for the second flip-flop 18, which is set through the tapping of the sensor-active region S, to be reset again by targeted removal of the finger. This then produces the function of a key. However, it is advantageous when the clearing of the flip-flop 18 is not achieved until the finger has been removed a few millimeters from the glass plate 31, so as to prevent the flip-flop from being cleared inadvertently through a minimal displacement. This problem is solved as follows in the exemplified embodiment represented in this case:

The instantaneous value of the control signal $U_R(t)$, which is situated at the output of the operation amplifier 11, is scanned and stored at a moment at which the approximating object is still situated just in front of the operator interface. To achieve this, this signal is supplied to the delay circuit 20. The voltage value $U_{20}$, which is situated at the output of the delay circuit 20, is stored in the memory 21 at the moment $t_0$ at which there is a signal situated at the output of the first threshold value switch 17, that is to say at the moment at which the first threshold value switch 17 has recognized the moment of the tapping. The value $U_R(t_0)$, stored in this way, is supplied to a first input of the comparator 22. The control signal with the value $U_R(t)$ is located at the second input of the comparator. As long as the value of the control signal is above the value at the output of the memory 21, the comparator circuit 22 does not supply an output signal. However, if the value of the control signal at moment $t_1$ falls below the stored value, the output of the comparator is set to active. The signals $U_{20}$, $U_R(t)$ and $U_R(t_0)$ are represented in FIG. 6. The second flip-flop 18 is reset with this signal.

The principle of the invention is fundamentally based on evaluating a useful signal originating from a proximity sensor, more especially from an opto-electronic proximity sensor, the value U(t) of which useful signal changes when an object is moved nearer to the proximity sensor and when it is removed away from the proximity sensor and the direction and amount of this change are characteristic of the direction and speed and/or distance of the object.

To this end, a first recognizing means 17 changes its switching state from a first state to a second state when the value U(t) of the useful signal or a value $U_1(t)$ of a first signal generated from the useful signal exceeds or falls below a first limit value which is characteristic of the approximation of an object. A second recognizing means 34 changes its switching state from a first state to a second state when the value U(t) of the useful signal or the value of a second signal generated from this useful signal exceeds or falls below a second limit value which is characteristic of the removal of an object. Connected to the recognizing means 17, 34 is a deciding means 32, which changes its output state from a first state to a second state when the first recognizing means 17 changes its switching state from its first state to its second switching state and the second recognizing means does not change its switching state within a predetermined first time slot Δt1 once the switching state of the first recognizing means has been changed.

The principle can include more elements in a further development. For example, in this way a third recognizing means resets the output state of the deciding means from the second state back to the first output state when the value U(t) of the useful signal or the value $U_3(t)$ of a third signal generated from this useful signal falls below or exceeds a third limit value which is characteristic of the removal of the object. The third limit value is preferably generated from the time curve of the useful signal or of a signal generated by the useful signal. This third limit value corresponds to the value U(t) of the useful signal or of a signal generated by the useful signal at a moment, which lies a certain predetermined time slot before the moment ($t_0$) of the changing of the state of the first recognizing means (17). This can be achieved by a fixed part factor or by a time-delaying of the control signal $U_R(t)$, so as to be independent of appearances of wear and tear, for example, on the surface of the switch. Useful signal, first signal and second signal are preferably analogue voltage signals.

In the deciding means the first recognizing means 17 sets a first flip-flop 32 and the second recognizing means 34 resets the first flip-flop 32. A time detection circuit 33, which is connected to the output of the first flip-flop 17, is set to active when the out-put of the first flip-flop 32 has been set to active for a time slot which is longer than the predetermined time slot $\Delta t_1$. The output of the time detection circuit 33 sets a second flip-flop 18.

This can consequently be used to form an opto-electronic switch, which is equipped with at least one light-emitting transmitting element and at least one receiving element. The receiving element outputs its signals, the value of which depends on the amount of light received, to an evaluation unit, in which at least one switching element changes its switching state when the value of the first signal, or the value of another signal derived from this signal, exceeds or falls below predetermined limit values. Transmitting and receiving elements can be disposed in such a manner that the light coming from the transmitting element is diffused or reflected by objects, which are located within a certain region, or by a displaceable element, which is at a predetermined spacing from the receiving element and the transmitting element, such that at least one portion of this diffused or reflected light reaches the receiving element. Consequently, the change in the amount of reflected or diffused light, which is received by the receiving element, caused by a displacement of the object or by a displacement of the displaceable element, causes a change in state of the switching element if the displacement is inside the limits of a predetermined displacement pattern.

This displacement pattern is preferably a tapping of a defined region by finger, hand or another part of the body. For example, a defined region on a glass or plexiglass pane or on a photoconductor, which is coupled to the transmitting element and/or receiving element, can be tapped.

The addressed displaceable element can, for example, be a snap-type spring, as is sometimes used in conventional switches. The recognizing means either recognizes just the displacement pattern of this snap-type spring on its own or in addition to the approximation of the object. For example, the snap-type spring can be situated on the proximity sensor so as to show the user the switching effect in a tactile manner, however just the displacement of the displaceable element on its own can also be detected and evaluated. The snap-type spring is displaceable against a restoring force and can, for example, overcome a dead point when moving against the restoring force.

It will be appreciated by one skilled in the art that this description can be subject to the most varied modifications, changes and adaptations, which range in the region of equivalents to the attached claims.

This displacement pattern is preferably a tapping of a defined region by finger, hand or another part of the body. For example, a defined region on a glass or plexiglass pane or on a photoconductor, which is connected to the transmitting element and/or receiving element, can be tapped.

The addressed displaceable element can, for example, be a snap-type spring, as is sometimes used in conventional switches. The recognizing means either recognizes just the displacement pattern of this snap-type spring on its own or in addition to the approximation of the object. For example, the snap-type spring can be situated on the proximity sensor so as to show the user the switching effect in a tactile manner, however just the displacement of the displaceable element on its own can also be detected and evaluated. The snap-type spring is displaceable against a restoring force and can, for example, overcome a dead point when moving against the restoring force.

What is claimed:

1. Device for evaluating a useful signal having a value, the useful signal originating from a proximity sensor, wherein the value of the useful signal changes with an approach of an object to the proximity sensor and with a removal of the object from the proximity sensor and wherein direction and amount of this change are characteristic of at least one of direction, speed, and distance of the object, comprising:

a first recognizing means having an output which changes from a first switching state to a second switching state when a first value of the useful signal, or a first value of a first signal generated from the useful signal, exceeds or falls below a first limit value which is characteristic of the object approaching the proximity sensor;

a second recognizing means having an output which changes from a first switching state to a second switching state when a second value exceeds or falls below a second limit value, which is characteristic of at least one of the object approaching the proximity sensor and the object being removed from the proximity sensor;

a first deciding means coupled to the output of the first recognizing means and the output of the second recognizing means, and having an output which changes from a first switching state to a second switching state when the first recognizing means changes its switching state and when the second recognizing means maintains its switching state, and wherein the first deciding means remains in the second switching when the second recognizing means maintains its switching state for a predetermined first time slot after the switching state of the first recognizing means has been changed;

a time detection circuit having an output, the time detection circuit being coupled to the output of the first deciding means, the output of the time detection circuit being set to an active state when the output of the first deciding means is set to an active state for a time slot which is longer than the predetermined time slot; and a second deciding means coupled to the output of the time detection circuit and being set when the output of the time detection circuit is set to its active state.

2. Device according to claim 1, wherein the proximity sensor comprises an opto-electronic proximity sensor.

3. Device according to claim 1, further comprising a third recognizing means which resets the state of the second deciding means from the second switching state back to the first switching state when the value of the useful signal or the value of a third signal generated from this useful signal falls below or exceeds a third limit value, which is characteristic of the removal of the object.

4. Device according to claim 3, wherein the third limit value is generated from a time curve of at least one of the useful signal and a signal generated from the useful signal.

5. Device according to claim 4, wherein the third limit value corresponds to the value of the useful signal or of a signal generated from the useful signal, at a moment which lies a predetermined time slot before the changing of the switching state of the first recognizing means.

6. Device according to claim 1, wherein the second deciding means is coupled downstream of the first and second recognizing means and further comprising an electric switching element coupled downstream of the second deciding means such that a change in the switching state of the second deciding means results in switching the electric switching element.

7. Device according to claim 1, wherein the useful signal and the first signal comprise analog voltage signals.

8. Device according to claim 1, wherein the first recognizing means comprises a high-pass filter, at the input of which is the useful signal, and a first threshold value switch, which is coupled downstream of the high-pass filter.

9. Device according to claim 1, wherein the second recognizing means comprises a second threshold value switch, at the input of which is the useful signal.

10. Device according to claim 1, wherein
the first deciding means comprises a first flip-flop having a set input which is coupled to an output of a first threshold value switch and a reset input which is coupled to an output of a second threshold value switch;
the time detection circuit comprises an input coupled to an output of the first deciding means, and an output set to active when the output of the first deciding means has been set to active for a time slot which is longer than the predetermined time slot; and
the second deciding means comprises a set input coupled to the output of the time detection circuit.

11. Device according to claim 1, wherein the object comprises at least one of a finger, a hand, and a body part of a user, and wherein the predetermined first time slot corresponds to a normal dwell time of at least one of the finger, the hand, and the body part when tapping a switch which is configured as an electric switching element.

12. Device according to claim 3, wherein the third recognizing means comprises:
a delay circuit having an input for receiving a third signal generated from the useful signal, the delay circuit having an output;
a memory having a first input coupled to the output of the delay circuit, a second input coupled to the first recognizing means, and an output; and
a comparator having a first input coupled to the third signal generated from the useful signal, a second input coupled to the output of the memory, and an output coupled to a reset input of the second deciding means.

13. Method for evaluating a useful signal originating from a proximity sensor, wherein a value of the useful signal or a value of an other signal generated from the useful signal changes when an object approaches the proximity sensor and when the object is removed from the proximity sensor, and wherein direction and amount by which at least one of the useful signal and the other signal changes are characteristic of direction, speed, and distance of the object, comprising the steps of:
recognizing an approach of the object and switching a first recognizing means from a first switching state to a second switching state when the value of the first signal exceeds or falls below a first limit value which is characteristic of the object approaching the proximity sensor;
recognizing an approach of the object and switching a second recognizing means from a first switching state to a second switching state when the value of the other signal exceeds or falls below a second limit value characteristic of the object approaching the proximity sensor;
changing an output state of a first deciding meanswhich is coupled to at least one of the first recognizing means and the second recognizing means when the first recognizing means changes switching states and when the second recognizing means maintains its switching state;
recognizing a removal of the object by switching the second recognizing means;
maintaining the second state of the deciding means when the second recognizing means maintains its switching state for a predetermined first time slot after the switching state of the first recognizing means has been changed;
setting to active an output of a time detection circuit, which is coupled to an output of the first deciding means, when the output of the first deciding means has been set to active for a time slot which is longer than the predetermined time slot; and
coupling a second deciding means to the output of the time detection circuit and setting to active an output of the second deciding means, when the output the time detection circuit is set active.

14. Method according to claim 13, wherein the proximity sensor comprises an opto-electronic proximity sensor.

15. Method according to claim 1, further comprising the step of resetting, by way of a third recognizing means, an output state of the second deciding means from a second switching state back to a first switching state when at least one of (a) the value of the useful signal and (b) the value of a third signal generated from this useful signal falls below or exceeds a third limit value which is characteristic of a removal of the object.

16. Method according to claim 15, further comprising the step of generating the third limit value from a time curve of at least one of (a) the useful signal and (b) a signal generated from the useful signal, which lies a predetermined time slot before the changing of the switching state of the first recognizing means.

17. Method according to claim 13, further comprising the step of switching an electric switching element when the switching state of the second deciding means changes.

18. Method according to claim 13, further comprising the steps of:

setting the first deciding means when an output of the first recognizing means changes its switching state;

resetting the first deciding means when an output of the second recognizing means changes its switching state; setting to active an output of the time detection circuit, which is coupled to an output of the first deciding means, has been set to active when the output of the first deciding means has been set to active for a time slot which is longer than the predetermined time slot); and setting a second decision means when the output of the time detection circuit is set to active.

* * * * *